(12) United States Patent
Kaizuka

(10) Patent No.: US 7,772,705 B2
(45) Date of Patent: Aug. 10, 2010

(54) LOW THERMAL RESISTANCE PACKAGE

(75) Inventor: Masao Kaizuka, San Jose, CA (US)

(73) Assignee: Toshiba America Electronic Components, Inc., Irvine, CA (US)

( * ) Notice: Subject to any disclaimer, the term of this patent is extended or adjusted under 35 U.S.C. 154(b) by 869 days.

(21) Appl. No.: 11/049,386

(22) Filed: Feb. 2, 2005

(65) Prior Publication Data

US 2006/0170101 A1 Aug. 3, 2006

(51) Int. Cl.
*H01L 23/48* (2006.01)

(52) U.S. Cl. ............... 257/773; 257/786; 257/E23.069; 257/E23.07

(58) Field of Classification Search ................... 257/773
See application file for complete search history.

(56) References Cited

U.S. PATENT DOCUMENTS

| | | | |
|---|---|---|---|
| 4,835,598 A | 5/1989 | Higuchi et al. | |
| 5,216,278 A | 6/1993 | Lin et al. | |
| 5,640,048 A | 6/1997 | Selna | |
| 5,705,851 A | 1/1998 | Mostafazadeh et al. | |
| 5,894,410 A | 4/1999 | Barrow | |
| 5,959,356 A | 9/1999 | Oh | |
| 6,043,986 A * | 3/2000 | Kondo et al. | ................. 361/720 |
| 6,282,094 B1 | 8/2001 | Lo et al. | |
| 6,525,942 B2 * | 2/2003 | Huang et al. | ................. 361/704 |
| 6,528,882 B2 | 3/2003 | Ding et al. | |
| 6,657,296 B2 | 12/2003 | Ho et al. | |
| 6,744,125 B2 | 6/2004 | Camenforte et al. | |
| 2002/0066949 A1 * | 6/2002 | Ahn et al. | ..................... 257/684 |
| 2003/0230799 A1 * | 12/2003 | Yee et al. | ..................... 257/706 |

OTHER PUBLICATIONS

Jim Benson, "Thermal Characterization of Packaged Semiconductor Devices", intersil®, Technical Brief, TB379.3, Dec. 2002, pp. 1-11.
Bruce M. Guenin, Ph.D., Amkor Electronics, Inc., "Packaging: designing for thermal performance", ElectronicsCooling, May 1997.
"Data sheet", http://www.amkor.com/products/all_datasheets/PBGA.pdf, Rev. date Apr. 2004, pp. 1-2.

* cited by examiner

*Primary Examiner*—Thao X Le
*Assistant Examiner*—Ajay K Arora
(74) *Attorney, Agent, or Firm*—Tucker Ellis & West LLP

(57) ABSTRACT

Techniques for arranging ball grid arrays for producing low thermal resistance packages. One embodiment is for a ball grid array package that comprises a substrate, the substrate having a top surface and a bottom surface. A plurality of thermal balls are coupled to the bottom surface of the substrate, and at least one vias is positioned between every pair of the plurality of thermal balls. Other embodiments contemplate a ball grid array comprising thermal balls with a via located between every four thermal balls, wherein at least one vias is substituted for a thermal ball in the ball grid array.

14 Claims, 6 Drawing Sheets

LOW THERMAL RESISTANCE PACKAGE

BACKGROUND OF THE INVENTION

The present invention relates generally to packaging, and more specifically to packaging with low thermal resistance.

The trend within the electronics industry is to provide increased computing power. However, increased computing power is making thermal management increasingly important. Higher device performance can create higher temperatures and lower reliability if thermal considerations aren't considered. Each calculation by each transistor, which can number in the millions, is accompanied by the generation of heat.

Although computing devices are increasing in computing power, the sizes of the computing devices are also shrinking. This can enable placing the computing devices closer together on smaller boards that helps decrease overall system size and cost, and can also improve electrical performance. Although these benefits are important, from a thermal standpoint raising power while reducing size is a bad combination.

One technique employed to reduce thermal resistance of a package such as a printed circuit board (PCB) is to use a ball grid array (BGA) such as a plastic ball grid array (PBGA). BGA packages have a plurality of solder balls located on a bottom external surface of a package substrate. The solder balls are reflowed to attach the package to a printed circuit board. An integrated circuits (IC) is mounted to a top surface of the package substrate, and electrically coupled to the solder balls by internal routing within the package. However, even a BGA package may have insufficient thermal impedance. For example, the number of solder balls is limited by the physical area of the bottom of the substrate. Thus, it would be desirable to provide a BGA package that has a lower thermal impedance than BGA packages of the prior art.

BRIEF SUMMARY OF THE INVENTION

The present invention comprises techniques for arranging ball grid arrays for producing low thermal resistance packages. In accordance with an aspect of the present invention, there is disclosed herein a ball grid array package. The package comprises a substrate, the substrate having a top surface and a bottom surface. A plurality of thermal balls are coupled to the bottom surface of the substrate, and at least one vias is positioned between every pair of the plurality of thermal balls.

In accordance with another aspect of the present invention, there is disclosed herein a ball grid array package, comprising a substrate having a top surface and a bottom surface. The substrate comprising a plurality of layers, including a solder resist layer, having a top side, the top side forming the top surface of the substrate, a top copper trace layer coupled to the solder resist layer, an insulator layer coupled to the top copper trace layer, a first inner copper plane layer coupled to the insulator layer, a base material layer coupled to the first inner copper plane layer, a second inner copper plane layer coupled to the insulator layer, a second insulator layer coupled to the second inner copper plane layer, and having a bottom side, the bottom side forming the bottom surface of the substrate. A plurality of thermal balls are coupled to the bottom surface of the substrate. At least one vias is positioned between every pair of the plurality of thermal balls.

In accordance with an aspect of the present invention, there is disclosed herein ball grid array arrangement. The ball grid array arrangement comprising a first row comprising six vias, a second row comprising five vias, a third row comprising a first vias, four thermal balls and a second vias, a fourth row comprising five vias, a fifth row row comprising one via, one thermal ball, second and third vias, a second thermal ball and a fourth via, a sixth row comprising five vias, a seventh row comprising a first via, a first thermal ball, second and third vias, a second thermal ball and a fourth via, a eighth row comprising five vias, a ninth row comprising a first vias, four thermal balls and a second vias, a tenth row comprising five vias, and an eleventh row comprising six vias.

In accordance with another aspect of the present invention, there is disclosed herein a ball grid array arrangement. The ball grid array arrangement comprising a first row comprising six vias, a second row comprising five vias, a third row comprising a first via, a first thermal ball, second and third vias, a second thermal ball and a fourth vias, a fourth row comprising five vias, a fifth row comprising first and second vias, two thermal balls and third and fourth vias, a sixth row comprising five vias, a seventh row comprising first and second vias, two thermal balls and third and fourth vias, an eighth row comprising five vias, a ninth row comprising a first via, a first thermal ball, second and third vias, a second thermal ball and a fourth via, a tenth row comprising five vias, and an eleventh row comprising six vias;

In accordance with another aspect of the present invention, there is disclosed herein a method for arranging a ball grid array. The method comprising creating an array of thermal balls, and inserting at least one via between every pair of thermal balls.

In accordance with another aspect of the present invention, there is disclosed herein a method for arranging a ball grid array. The method comprises generating a thermal ball array, inserting one via between every four thermal balls, and substituting a via for at least one thermal ball.

Still other objects of the present invention will become readily apparent to those skilled in this art from the following description wherein there is shown and described a preferred embodiment of this invention, simply by way of illustration of one of the best modes best suited for to carry out the invention. As it will be realized, the invention is capable of other different embodiments and its several details are capable of modifications in various obvious aspects all without from the invention. Accordingly, the drawing and descriptions will be regarded as illustrative in nature and not as restrictive.

BRIEF DESCRIPTION OF THE SEVERAL VIEWS OF THE DRAWING

The accompanying drawings incorporated in and forming a part of the specification, illustrates several aspects of the present invention, and together with the description serve to explain the principles of the invention.

DETAILED DESCRIPTION OF INVENTION

Throughout this description, the preferred embodiment and examples shown should be considered as exemplars, rather than limitations, of the present invention.

Figure 1:
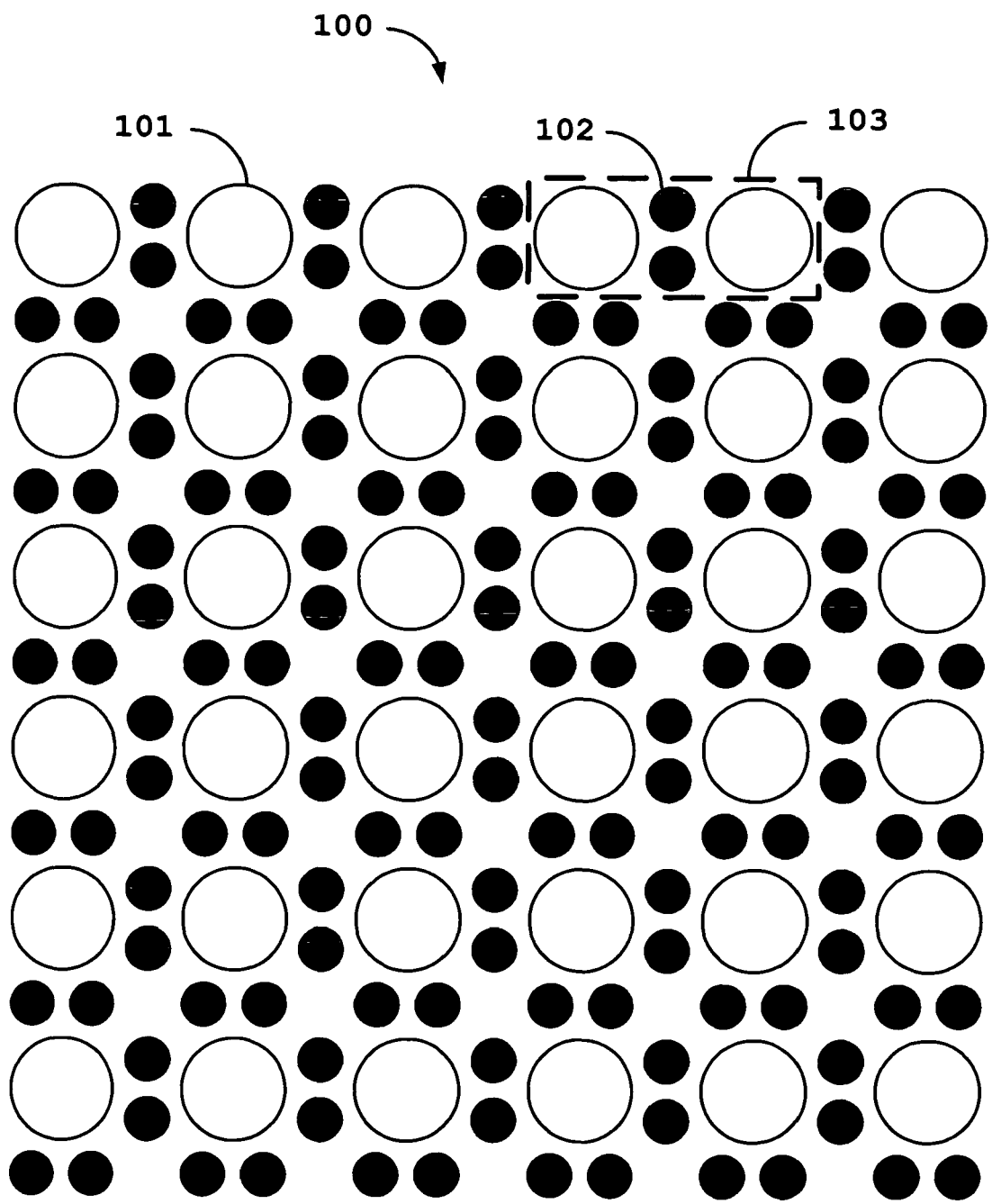
FIG. 1 is an exemplary thermal ball arrangement in accordance with an aspect of the present invention.

The present invention contemplates techniques for reducing the thermal resistance of a package, such as a Large Scale Integration (LSI) package for a semiconductor device. Referring to FIG. 1, there is illustrated an exemplary ball grid array 100 in accordance with an aspect of the present invention. Thermal balls 101, as shown in this example, are arranged in a 6×6 rectangular ball grid array. Between each pair of thermal balls 103, is a pair of through-holes (vias) 102. In contrast, the typical prior art arrangement (not shown) typically has only one vias located where four thermal balls intersect. Thus, the prior art arrangement has a total of 25 vias, whereas the arrangement as illustrated in FIG. 1 has an additional 95 vias, or 120 vias total. As will be described hereinafter, the additional vias reduce the thermal resistance of the package 100. Although as shown in FIG. 1 there are two vias 102 between each pair of thermal balls 103, the present invention contemplates as few as one vias 102 between each pair of thermal balls 103 resulting in a total of 60 vias for a 6×6 grid arrangement, or any number of vias between each pair of thermal balls 103, resulting in 60×n vias, where n is an integer greater than 0.

Figure 2:
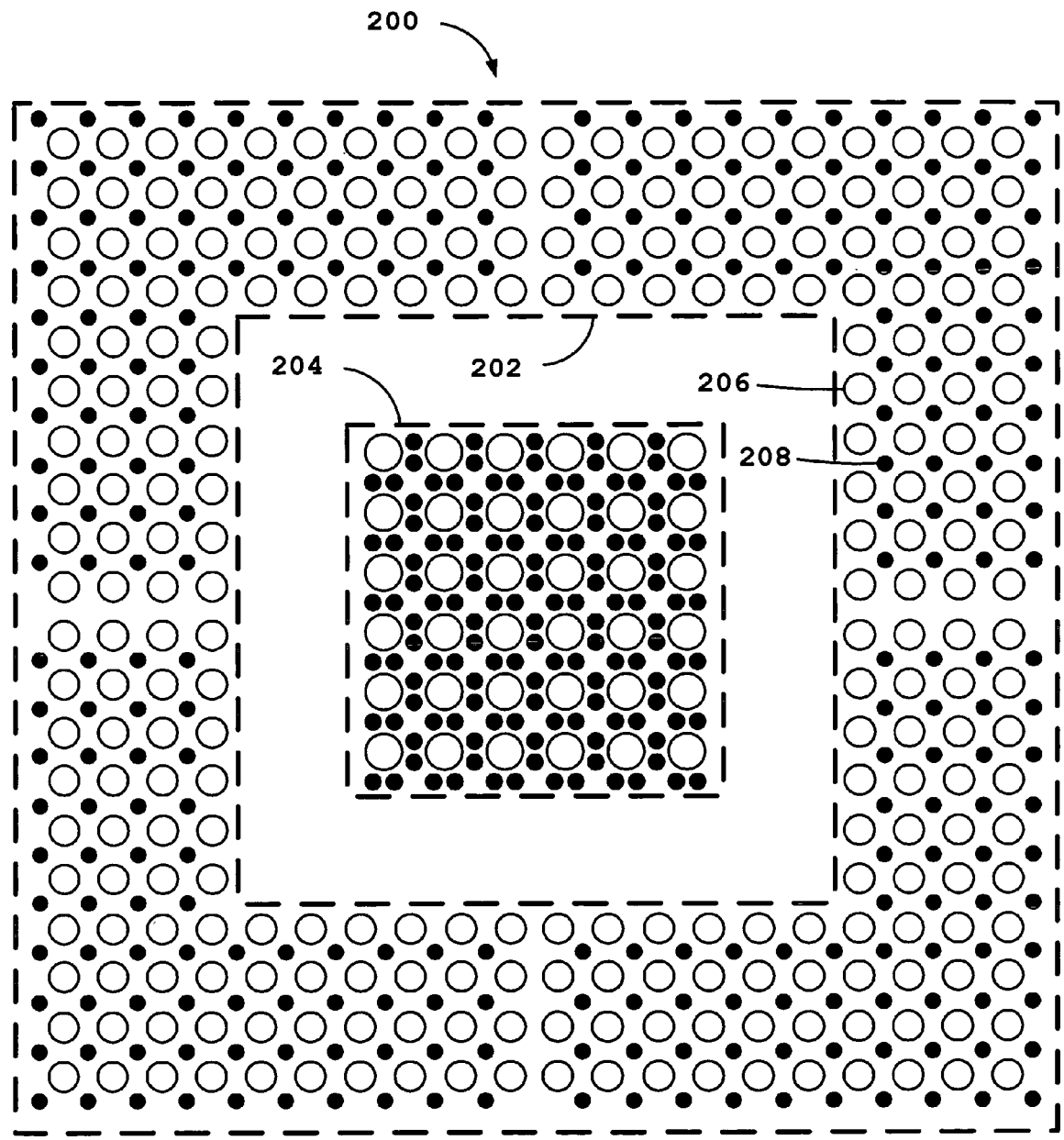
FIG. 2 is an exemplary thermal ball arrangement in accordance with an aspect of the present invention.

FIG. 2 illustrates an exemplary thermal ball arrangement 200 in accordance with an aspect of the present invention. Arrangement 200 comprises an outer ball grid array 202 and an inner ball grid array 204. The outer ball grid array 202 has thermal balls 206 and vias 208 arranged with one vias 208 at the intersection of every four thermal balls 208. However, the inner ball grid array 204 is arranged using the arrangement 100 as illustrated in FIG. 1. Thus, although outer grid array 202 of arrangement 200 utilizes a more conventional thermal ball arrangement, the thermal resistance of the arrangement 200 is reduced because the inner grid array 204 uses the arrangement 100 described in FIG. 1.

Figure 3:
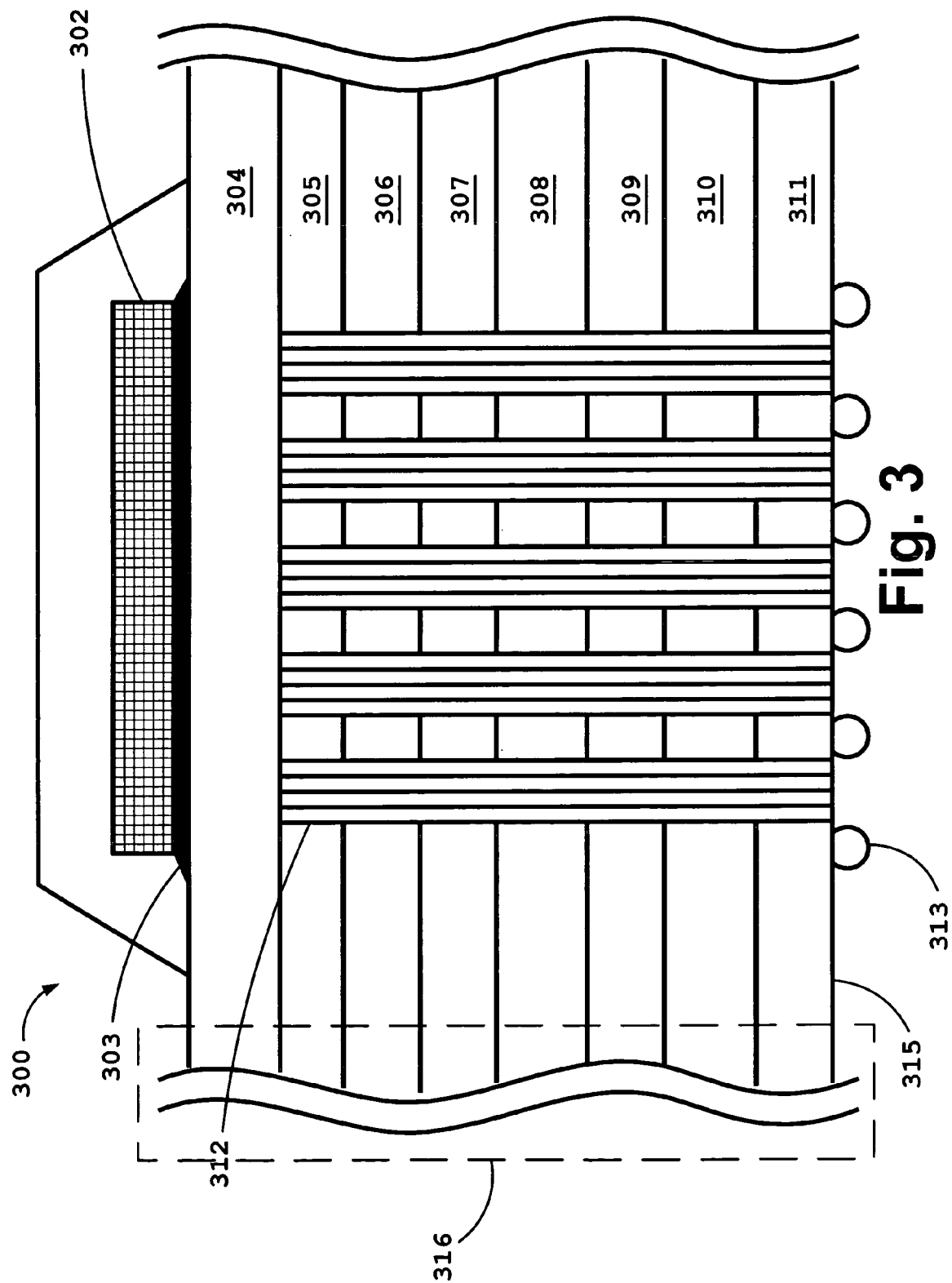
FIG. 3 is a cutaway view of a ball grid array package in accordance with an aspect of the present invention.

FIG. 3 is a cutaway view of a ball grid array package 300 in accordance with an aspect of the present invention. The package 300 comprises a device that generates heat 302, such as a silicon chip. The device 302 is coupled to the top surface 314 of a bare laminate PCB (substrate) 316 using an adhesive 303, such as a die attach. Thermal balls (e.g., solder balls) 313 are located at the bottom of package 315. Substrate 316 comprises a solder resist layer 304 that is coupled to device 302 with adhesive 303. Below the solder resist layer 304 is a top copper trace 305. Below the top copper trace 305 is a laminated insulator layer 306, such as prepreg. Inner copper plane 307 is below the laminated insulator layer 306. Base material (e.g., glass epoxy) 308 is below the inner copper plane 307. A second inner copper plane 309 is under the base material 308. A second insulator layer (e.g., prepreg) 310 is under the second copper plane 309. A bottom copper layer 311 is under the second insulator layer 310 is the bottom 314 of package 300. Vias 312 starts at the bottom 315 of substrate 316 and passes through the bottom copper trace 311, second insulator layer 310, second inner copper plane 309, base material 308, inner copper plane 307, laminated insulator layer 306 and top copper trace 305 and ends at solder resist layer 304. Although the above description refers to copper layers, any material that has a low thermal resistance can be substituted. Likewise, any material with a high thermal resistance can be substituted for the insulator layers.

Figure 4:
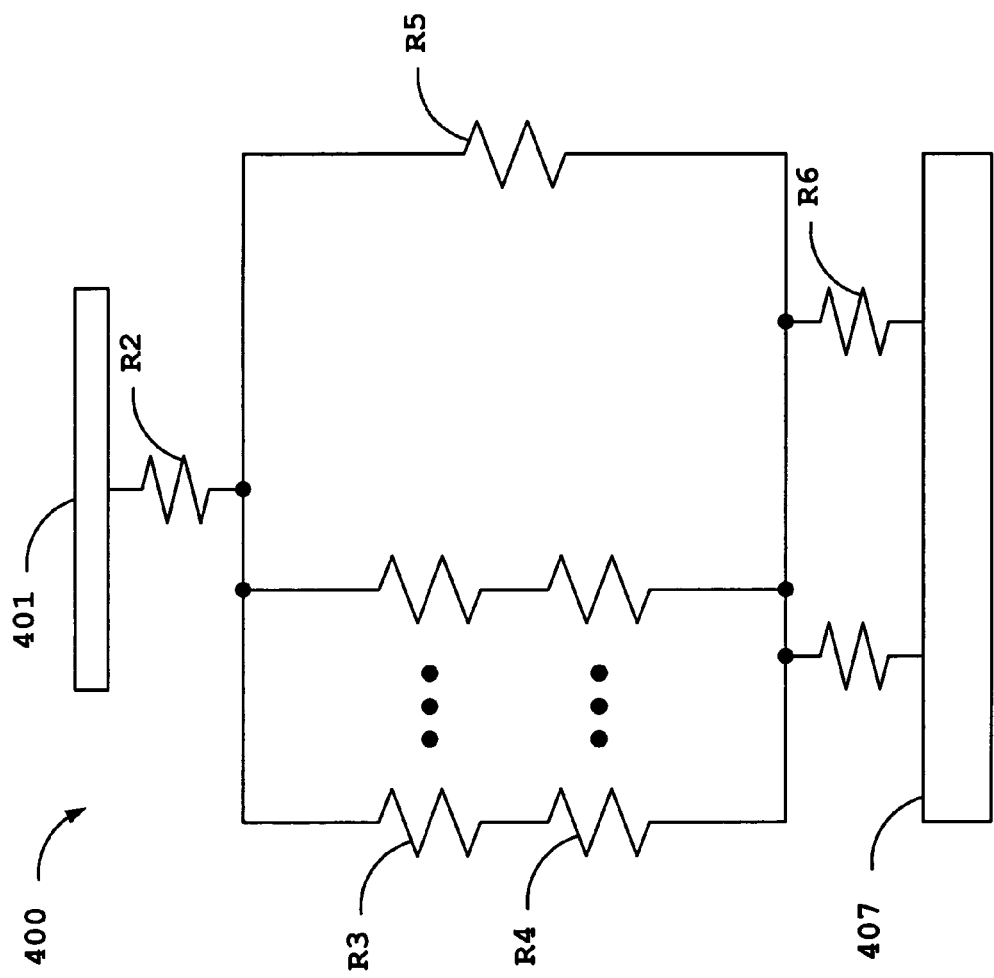
FIG. 4 is an equivalent circuit diagram of a ball grid array package in accordance with an aspect of the present invention.

The heat distribution through package 300 will be explained with reference to FIG. 4. FIG. 4 is an equivalent circuit diagram 400 of a ball grid array package in accordance with an aspect of the present invention. A heat generating device 401 is shown as a conductor. For example, for a silicon chip, the thermal conductance of silicon is very high, thus the thermal resistance is almost zero. The heat from device 401 is then passed through chip mounting materials (e.g., adhesive 303 and solder resist 304 in FIG. 3), the thermal equivalent of which is represented by R2. R3 and R4 represent the thermal resistance of a via. R3 represents the thermal resistance of a through-hole and R4 the thermal resistance between a through-hole and a thermal ball. R5 represents the thermal resistance of the substrate 316. R6 represents the equivalent thermal resistance of thermal ball, which is connected to the mother board's copper plane 407.

A common method of characterizing a package device's thermal performance is with "Thermal Resistance", denoted by the Greek letter "theta" or θ. For a semiconductor device, thermal resistance indicates the steady state temperature rise of the die junction above a given reference for each watt of power (heat) dissipated at the die surface. Its units are degrees C/W (deg. C/W).

The most common examples are Theta-JA (junction to ambient), Theta-JC (junction to case), and Theta-JB (junction to board). Knowing the reference (i.e. ambient, case or board) temperature, the power and the relevant theta value, the junction temperature can be calculated. Theta-JA is commonly used with natural and forced convection air-cooled systems using components mounted on epoxy glass PCBs. Theta-JC is useful when the package has a high conductivity case mounted directly to a PCB or heatsink. Theta-JB applies when the board temperature adjacent to the package is known.

Based on the circuit 400 of FIG. 4, the Theta-JB is, $$Theta-JB = R2 + \frac{1}{\frac{NV}{(R3+R4)} + \frac{1}{R5}} + \frac{R6}{NT}$$

where
R2=thermal resistance of Die attach;
R3=thermal resistance of via;
R4=thermal resistance of via to ball;
R5=thermal resistance of printed circuit board (PCB) from top to bottom;
R6=thermal resistance of a thermal ball (solder ball);
NV=number of via;
NT=number of thermal balls.

As an example, Table 1 shows an exemplary thermal resistance calculation listing each element of package 300 (FIG. 3). The calculation in Table 1 sets the number of thermal balls and vias to one to illustrate the unit resistance of these elements. In the example of Table 1, the calculations assume the thermal resistance of a via is about 106 degrees C/W and the thermal resistance of a thermal ball is 0.40 degrees C/W.

TABLE 1

Thermal Resistance Calculation:

| ITEM | Thermal Conductance | Tickness (mm) | Quantity | Thermal Resistance |
|---|---|---|---|---|
| Die Attach | 3.10 | 0.03 | 1.00 | 0.20 |
| S/R | 0.23 | 0.03 | 1.00 | 2.66 |
| Top Trace | 395.00 | 0.02 | 1.00 | 0.00 |
| Dieletric + vias | 0.34 | 0.10 | 1.05 | 5.72 |
| Plane | 395.00 | 0.04 | 1.22 | 0.00 |
| Dielectric + vias | 0.34 | 0.10 | 1.28 | 7.78 |
| Plane | 395.00 | 0.04 | 1.22 | 0.00 |
| Dielectric + vias | 0.34 | 0.10 | 1.28 | 4.70 |
| Bottom trace | 395.00 | 0.02 | 1.34 | 0.00 |
| Pkg vias top to bottom | 395.00 | 0.46 | 1.00 | 106.13 |
| Thermal Balls | 12.90 | 0.25 | 1.00 | 0.40 |
| Thermal Resistance, Theta-JB | 18.79 Deg, C/W | | | |

Table 2, herein below, is an example calculation for a package 300 (FIG. 3) having a 6×6 ball grid array (not shown) that has one via between four thermal balls. Thus, there are 36 thermal balls and 25 vias (one via between 4 thermal balls).

TABLE 2

Thermal Resistance Calculation using 36 thermal balls and 25 vias:

| ITEM | Thermal Conductance | Tickness (mm) | Quantity | Thermal Resistance |
|---|---|---|---|---|
| Die Attach | 3.10 | 0.03 | 1.00 | 0.20 |
| S/R | 0.23 | 0.03 | 1.00 | 2.66 |
| Top Trace | 395.00 | 0.02 | 1.00 | 0.00 |
| Dieletric + vias | 0.34 | 0.10 | 1.05 | 5.72 |
| Plane | 395.00 | 0.04 | 1.22 | 0.00 |
| Dielectric + vias | 0.34 | 0.10 | 1.28 | 7.78 |
| Plane | 395.00 | 0.04 | 1.22 | 0.00 |
| Dielectric + vias | 0.34 | 0.10 | 1.28 | 4.70 |
| Bottom trace | 395.00 | 0.02 | 1.34 | 0.00 |
| Pkg vias top to bottom | 395.00 | 0.46 | 25.00 | 4.25 |
| Thermal Balls | 12.90 | 0.25 | 36.00 | 0.01 |
| Thermal Resistance, Theta-JB | 6.31 Deg. C/W | | | |

As can be seen from Table 2, the additional thermal balls lower the thermal resistance of the thermal balls from 0.40 to 0.01 deg, C/W, while the additional vias reduce the resistance from 4.25 to 0.88 deg. C/W. This reduces the total theta-JB thermal resistance from 18.79 deg. C/W to 6.31 deg. C/W.

Table 3, below, is an example calculation for a thermal ball arrangement using the structure of package 300 and the arrangement 100 as shown in FIG. 1. As stated above supra, the arrangement is a 6×6 ball grid array that comprises 36 thermal balls and 120 vias. For brevity, the package vias and thermal balls thermal resistances are shown in Table 3, the remaining items are the same as listed in Tables 1 and 2.

TABLE 3

Thermal Resistance calculation for arrangement of FIG. 1

| ITEM | Thermal Conductance | Tickness (mm) | Quantity | Thermal Resistance |
|---|---|---|---|---|
| PKG vias top to bottom | 395.00 | 0.46 | 120.00 | 0.88 |
| Thermal Balls | 12.90 | 0.25 | 36.00 | 0.01 |
| Thermal Resistance, Theta-JB | 3.71 Deg. C/W | | | |

As can be observed from Table 3, the thermal resistance of vias, including the additional vias that are in parallel, is 0.88 deg. C/W and the thermal resistance of the thermal balls is 0.01 deg. C/W (the same as in table 2). However, because of the additional vias, the theta-JB thermal resistance decreases from 6.31 Deg. C/W to 3.71 Deg. C/W.

Figure 6:
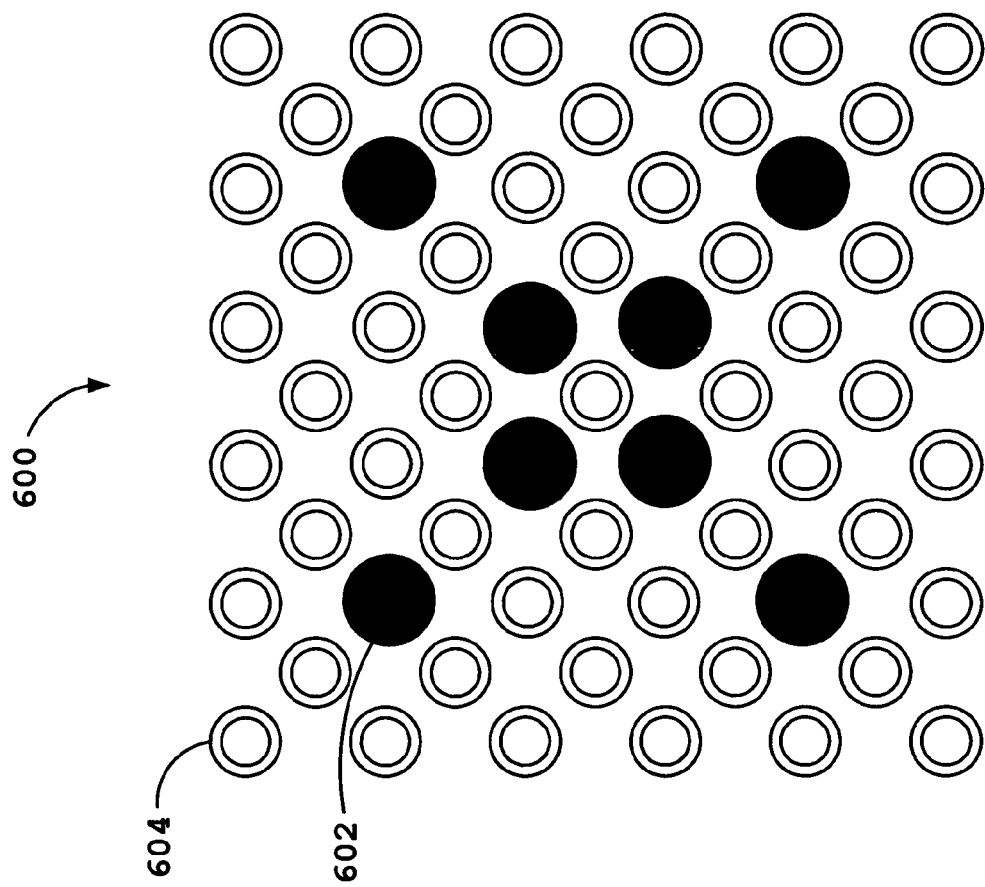
FIG. 6 is an alternative exemplary thermal ball arrangement in accordance with an aspect of the present invention.
Figure 5:
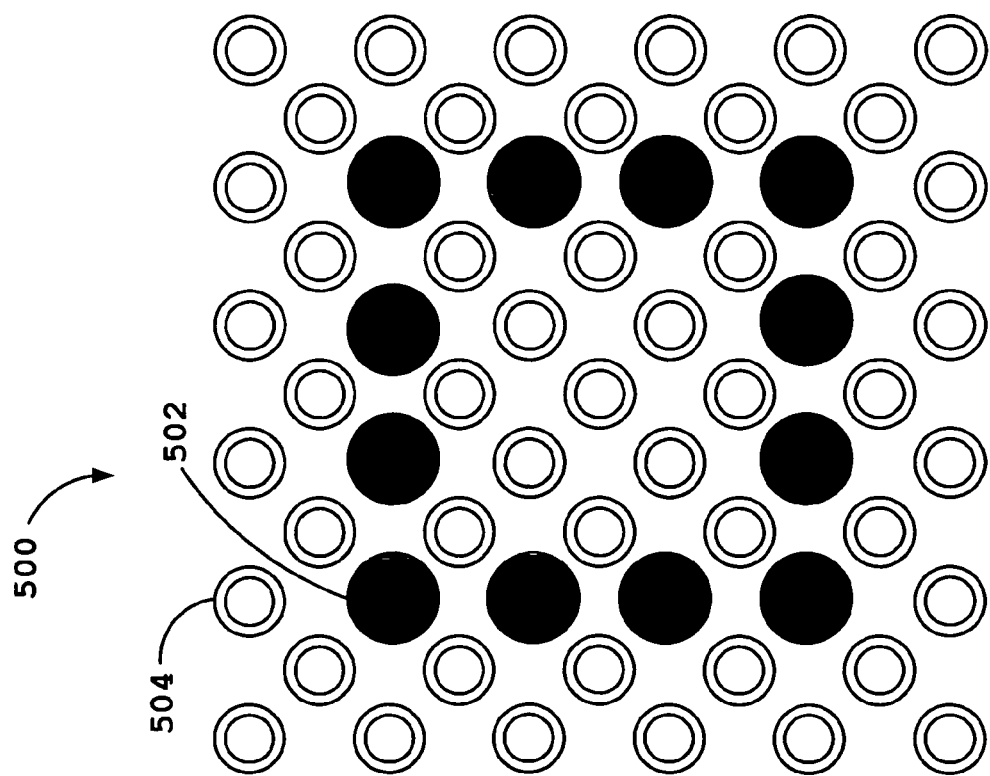
FIG. 5 is an alternative exemplary thermal ball arrangement in accordance with an aspect of the present invention.

Referring now to FIGS. 5 and 6, there are illustrates alternative embodiments 500, 600 of the present invention. The embodiments 500, 600 exemplified in FIGS. 5 and 6 are 6×6 ball grid arrays having a via between four balls. For a 6×6 ball grid array, this would result in 25 vias. In embodiments 500, 600 at least one location substitutes a via for a thermal ball. Using this type of approach, the best results can be expected when one thermal ball is used with 60 vias. However, for topological reasons, a one ball ball grid array may not be practical.

Referring first to FIG. 5, embodiment 500 is an arrangement that comprises thermal balls 502 and vias 504. The layout is similar to a 6.times.6 thermal ball grid. However, in this arrangement, vias 1, 2, 3, 4, 5, 6, 7, 12, 13, 15, 16, 18, 19, 21, 22, 24, 25, 30, 31, 32, 33, 34, 35 and 36 are substituted for thermal balls at their respective locations. This arrangement yields 12 thermal balls and 49 vias. Assuming a package structure similar to structure 300 (FIG. 3), and using the thermal resistance circuit similar to circuit 400 (FIG. 4), and further assuming the thermal resistances for the elements not shown are the same as in table 1, table 4 illustrates an example calculation for embodiment 500 of FIG. 5.

TABLE 4

Thermal Resistance calculation for arrangement of FIG. 5

| ITEM | Thermal Conductance | Tickness (mm) | Quantity | Thermal Resistance |
|---|---|---|---|---|
| PKG vias top to bottom | 395.00 | 0.46 | 49.00 | 2.17 |
| Thermal Balls | 12.90 | 0.25 | 12.00 | 0.03 |
| Thermal Resistance, Theta-JB | 4.83 Deg. C/W | | | |

Referring now to FIG. 6, embodiment 600 is an arrangement that comprises thermal balls 602 and vias 604. In this embodiment, the thermal balls along the perimeter of a 6.times.6 array are replaced with vias 1, 2, 3, 4, 5, 6, 7, 12, 13, 18, 19, 24, 25, 30, 31, 32, 33, 34, 35, and 36. In addition, half the thermal balls at the outermost layer are replaced by vias 9, 10, 14, 19, 20, 23, 27, and 28. This arrangement results in 8 thermal balls and 53 vias. Assuming a package structure similar to structure 300 (FIG. 3), and using the thermal resistance circuit similar to circuit 400 (FIG. 4), and further assuming the thermal resistances for the elements not shown are the same as in table 1, table 5 illustrates an example calculation for embodiment 600 of FIG. 6.

TABLE 5

Thermal Resistance calculation for arrangement of FIG. 6

| ITEM | Thermal Conductance | Tickness (mm) | Quantity | Thermal Resistance |
|---|---|---|---|---|
| PKG vias top to bottom | 395.00 | 0.46 | 53.00 | 2.00 |
| Thermal Balls | 12.90 | 0.25 | 8.00 | 0.05 |
| Thermal Resistance, Theta-JB | 4.71 Deg. C/W | | | |

Thus, as can be observed from tables 4 and 5, the embodiments 500, 600 of FIGS. 5 and 6 show an improved thermal resistance when compared to the typical 6×6 ball grid array having 36 thermal balls and 25 vias.

Figure 7:
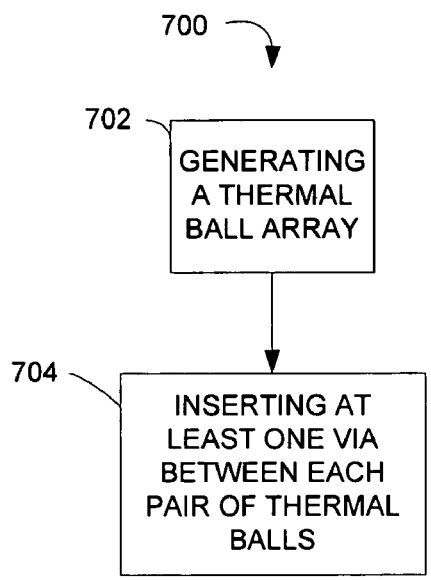
FIG. 7 is a methodology for creating a ball grid array in accordance with an aspect of the present invention.
Figure 8:
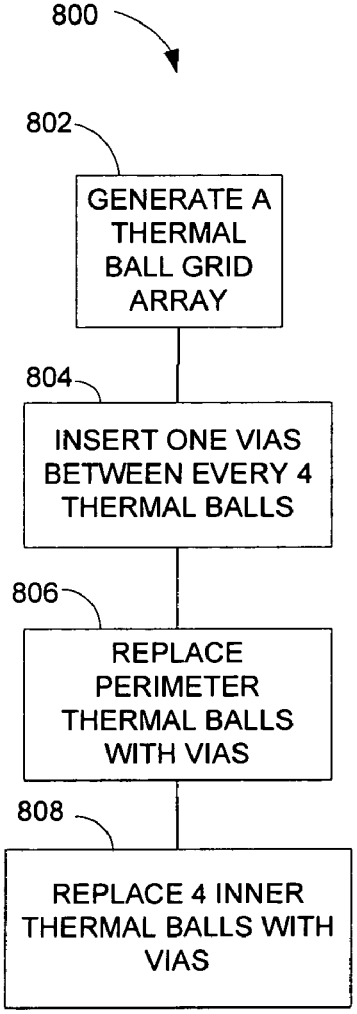
FIG. 8 is a methodology for creating an alternative ball grid array in accordance with another aspect of the present invention.
Figure 9:
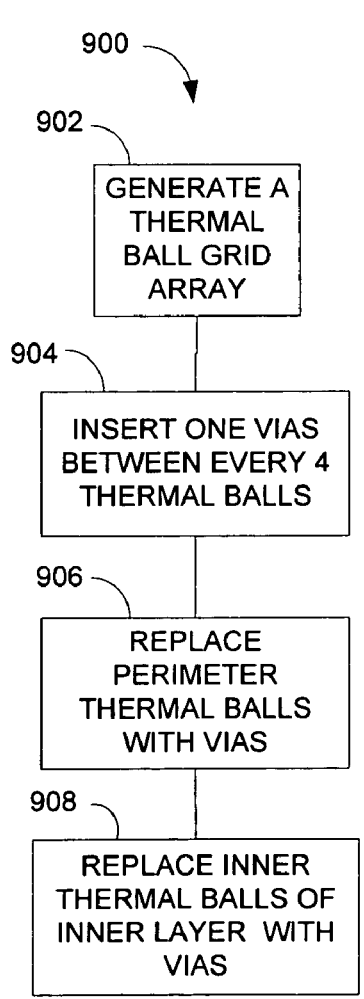
FIG. 9 is a methodology for creating another alternative ball grid array in accordance with an aspect of the present invention.

In view of the foregoing structural and functional features described above, methodologies in accordance with various aspects of the present invention will be better appreciated with reference to FIGS. 7-9. While, for purposes of simplicity of explanation, the methodologies of FIGS. 7-9 are shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 7 is a methodology 700 for creating a ball grid array in accordance with an aspect of the present invention. At 702, a thermal ball grid array is generated. The array is typically a rectangular array, although other shapes are adaptable to the principles of the present invention. For example, the array can be a 6×6 ball grid array as illustrated in FIG. 1. The array comprises at least two thermal balls. At 704, at least one via is inserted between each pair of thermal balls. For example, as illustrated in FIG. 1, two vias 102 can be inserted between each pair of thermal balls 103. The number of vias inserted may be limited by the size and placement of the thermal balls and the mechanical properties of the substrate.

FIG. 8 is a methodology 800 for creating an alternative ball grid array in accordance with another aspect of the present invention. At 802, a thermal ball grid array is generated. The array is typically a rectangular array, although other shapes are adaptable to the principles of the present invention. For example, the array can be a 6×6 ball grid array as illustrated in FIG. 1. At 804, a via is inserted between every four thermal balls. This arrangement for a 6×6 grid array would normally comprise 36 thermal balls and 25 vias. At 806, the thermal balls on the outer perimeter are replaced with vias. Thus, the outer perimeter of the grid array would comprise vias. For a 6×6 ball grid array, the innermost four thermal balls are replaced with vias at 808. The completion 802, 804, 806 and 808 on a 6×6 grid array would result in a ball grid array similar to FIG. 5, comprising 12 thermal balls and 49 vias. Although this description references a 6×6 ball grid array, those skilled in the art can readily appreciate that the principles of the present invention can be extrapolated to ball grid arrays of any size.

FIG. 9 is a methodology 900 for creating another alternative ball grid array in accordance with an aspect of the present invention. The methodology 900 will be explained using the example of a 6×6 ball grid array, however, as can be readily appreciated by those skilled in the art the principles of the present invention are adaptable to ball grid arrays of any size. At 902, a thermal ball grid array is generated. The array is typically a rectangular array, although other shapes are adaptable to the principles of the present invention. For example, the array can be a 6×6 ball grid array as illustrated in FIG. 1. At 904, a via is inserted between every four thermal balls. After the insertion of the via, this arrangement for a 6×6 grid array would normally comprise 36 thermal balls and 25 vias. At 906, the thermal balls on the outer perimeter are replaced with vias. Thus, the outer perimeter of the grid array would comprise vias. At 908, the thermal balls of the next layer that are not located at the corners are replaced by vias. For each layer, the positions at the four corners of the grid would still be thermal balls, while all the positions between the corners would be replaced with vias. For example, using a 6×6 ball grid array as shown in FIG. 6, the thermal balls located in positions between thermal balls 1 and 2, 1 and 7, 7 and 8, and 2 and 8 would be replaced by vias. The next layer, formed by thermal balls 3, 4, 5 and 6 would be intact because these thermal balls are the corners of the layer. Although this description references a 6×6 ball grid array, those skilled in the art can readily appreciate that the principles of the present invention can be extrapolated to ball grid arrays of any size.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims interpreted in accordance with the breadth to which they are fairly, legally and equitably entitled.

The invention claimed is:

1. A ball grid array arrangement for use with an associated substrate having a bottom surface, the ball grid array arrangement comprising:
   a first row comprising six vias opening at the bottom surface of the associated substrate;
   a second row comprising five vias opening at the bottom surface of the associated substrate;
   a third row comprising vias and thermal balls defined on the bottom surface of the associated substrate, the third row consisting essentially of a series arrangement along the third row of, in order: a first vias, four thermal balls and a second vias;
   a fourth row comprising five vias opening at the bottom surface of the associated substrate;
   a fifth row comprising vias and thermal balls defined on the bottom surface of the associated substrate, the fifth row consisting essentially of a series arrangement along the fifth row of, in order: one via, one thermal ball, second and third vias, a second thermal ball and a fourth via;
   a sixth row comprising five vias opening at the bottom surface of the associated substrate;
   a seventh row comprising vias and thermal balls defined on the bottom surface of the associated substrate, the seventh row consisting essentially of a series arrangement along the seventh row of, in order: a first via, a first thermal ball, second and third vias, a second thermal ball and a fourth via;
   an eighth row comprising five vias opening at the bottom surface of the associated substrate;
   a ninth row comprising vias and thermal balls defined on the bottom surface of the associated substrate, the ninth row consisting essentially of a series arrangement along the ninth row of, in order: a first vias, four thermal balls and a second vias;
   a tenth row comprising five vias opening at the bottom surface of the associated substrate; and
   an eleventh row comprising six vias opening at the bottom surface of the associated substrate, wherein each of the thermal balls of the ball grid array arrangement is coupled directly to the bottom surface of the associated substrate at areas spaced apart from each of the vias opening at the bottom surface of the associated substrate.

2. The ball grid array arrangement of claim 1, wherein the rows of the ball grid array are staggered such that each even numbered row starts at a position between the first and second element of the preceding odd numbered row.

3. The ball grid array arrangement of claim 1 wherein all of the vias of the ball grid array arrangement are spaced apart on the bottom surface of the associated substrate from all of the thermal balls of the ball grid array arrangement.

4. A ball grid array for use with an associated substrate having a bottom surface, the ball grid array comprising:
   a first row comprising six vias opening at the bottom surface of the associated substrate;
   a second row comprising five vias opening at the bottom surface of the associated substrate;
   a third row comprising vias and thermal balls defined on the bottom surface of the associated substrate, the third row consisting essentially of a series arrangement along the third row of: a first via, a first thermal ball, second and third vias, a second thermal ball and a fourth via;
   a fourth row comprising five vias opening at the bottom surface of the associated substrate;
   a fifth row comprising vias and thermal balls defined on the bottom surface of the associated substrate, the fifth row consisting essentially of a series arrangement along the fifth row of, in order: first and second vias, two thermal balls and third and fourth vias;
   a sixth row comprising five vias opening at the bottom surface of the associated substrate;
   a seventh row comprising vias and thermal balls defined on the bottom surface of the associated substrate, the seventh row consisting essentially of a series arrangement along the seventh row of, in order: first and second vias, two thermal balls and third and fourth vias;
   an eighth row comprising five vias opening at the bottom surface of the associated substrate;
   a ninth row comprising vias and thermal balls defined on the bottom surface of the associated substrate, the ninth row consisting essentially of a series arrangement along the ninth row of, in order: a first via, a first thermal ball, second and third vias, a second thermal ball and a fourth via;
   a tenth row comprising five vias opening at the bottom surface of the associated substrate; and
   an eleventh row comprising six vias opening at the bottom surface of the associated substrate, wherein each of the thermal balls of the ball grid array is coupled directly to the bottom surface of the associated substrate at areas spaced apart from each of the vias opening at the bottom surface of the associated substrate.

5. The ball grid array of claim 4, wherein the rows of the ball grid array are staggered such that each even numbered row starts at a position between the first and second element of the preceding odd numbered row.

6. The ball grid array of claim 4, wherein all of the vias of the ball grid array are spaced apart on the bottom surface of the associated substrate from all of the thermal balls of the ball grid array arrangement.

7. A ball grid arrangement for use with an associated substrate including a bottom surface, the ball grid arrangement comprising:
   an n×n array having 1 to n rows and 1 to n columns, where $n \geq 4$, the n×n array defining an array of n×n substantially rectangular areas in abutment on the bottom surface of the associated substrate;
   a plurality of vias opening at the bottom surface of the associated substrate, the plurality of vias being arranged in an $(n-1) \times (n-1)$ array on the bottom surface in a mutually spaced apart relationship, wherein each of the plurality of vias of the $(n-1) \times (n-1)$ array is disposed on the bottom surface of the associated substrate at a corresponding intersection of every four of the areas of the array of n×n areas on the bottom surface of the associated substrate;
   the $1^{st}$ row of the n×n array having n vias on the bottom surface of the associated substrate disposed at the $1^{st}$ row of the array of n×n areas;
   the $n^{th}$ row of the n×n array having n vias on the bottom surface of the associated substrate disposed at the $n^{th}$ row of the array of n×n areas;
   the $1^{st}$ column of the n×n array having n vias on the bottom surface of the associated substrate disposed at the $1^{st}$ column of the array of n×n areas;
   the $n^{th}$ column of the n×n array having n vias on the bottom surface of the associated substrate disposed at the $n^{th}$ column of the array of n×n areas;
   wherein a plurality of thermal balls are disposed in the n×n array within the $2^{nd}$ to $(n-1)^{th}$ rows and within the $2^{nd}$ to $(n-1)^{th}$ columns, the plurality of thermal balls being coupled to directly contact the bottom surface of the associated substrate at locations corresponding to i) the $2^{nd}$ row and the $(n-1)^{th}$ row of the array of n×n areas from the $2^{nd}$ to the $(n-1)^{th}$ column, and ii) the $2^{nd}$ column and the $(n-1)^{th}$ column of the array of n×n areas from the $2^{nd}$ to the $(n-1)^{th}$ row; and,
   wherein each of the vias of the ball grid arrangement are spaced apart between each pair of adjacent thermal balls on the bottom surface of the associated substrate.

8. A ball grid arrangement according to claim 7 wherein:
   wherein the plurality of thermal balls are selectively disposed in the n×n array solely within the $2^{nd}$ to $(n-1)^{th}$ rows and solely within the $2^{nd}$ to $(n-1)^{th}$ columns.

9. A ball grid arrangement according to claim 8 wherein:
   wherein the plurality of thermal balls selectively disposed in the n×n array solely within the $2^{nd}$ to $(n-1)^{th}$ rows and solely within the $2^{nd}$ to $(n-1)^{th}$ columns fill the $2^{nd}$ to $(n-1)^{th}$ rows and the $2^{nd}$ to $(n-1)^{th}$ columns.

10. A ball grid arrangement according to claim 7 wherein:
    the plurality of thermal balls are selectively disposed in the n×n array at corners defined by the $2^{nd}$ and $(n-1)^{th}$ rows and the $2^{nd}$ and $(n-1)^{th}$ columns.

11. A ball grid arrangement for use with an associated substrate including a bottom surface, the ball grid arrangement comprising:
    an n×m array having 1 to n rows and 1 to m columns, where $n \geq 4$ and $m \geq 4$, the n×m array defining an array of n×m substantially rectangular areas in abutment on the bottom surface of the associated substrate;
    a plurality of vias opening at the bottom surface of the associated substrate, the plurality of vias being arranged in an $(n-1) \times (m-1)$ array on the bottom surface in a mutually spaced apart relationship, wherein each of the plurality of vias of the $(n-1) \times (m-1)$ array is disposed on the bottom surface of the associated substrate at a corresponding intersection of every four of the areas of the array of n×n locations on the bottom surface of the associated substrate;
    the $1^{st}$ row of the n×m array having n vias on the bottom surface of the associated substrate disposed at the $1^{st}$ row of the array of n×m areas;
    the $n^{th}$ row of the n×m array having n vias on the bottom surface of the associated substrate disposed at the $m^{th}$ row of the array of n×m areas;
    the $1^{st}$ column of the n×m array having m vias on the bottom surface of the associated substrate disposed at the $1^{st}$ column of the array of n×m areas;

the $m^{th}$ column of the n×m array having m vias on the bottom surface of the associated substrate disposed at the $m^{th}$ column of the array of n×m areas;

wherein a plurality of thermal balls are disposed in the n×m array within the $2^{nd}$ to $(n-1)^{th}$ rows and within the $2^{nd}$ to $(m-1)^{th}$ columns, the plurality of thermal balls being coupled to directly contact the bottom surface of the associated substrate at locations corresponding to i) the $2^{nd}$ row and the $(n-1)^{th}$ row of the array of n×m areas from the $2^{nd}$ to the $(m-1)^{th}$ column, and ii) the $2^{nd}$ column and the $(m-1)^{th}$ column of the array of n×m areas from the $2^{nd}$ to the $(n-1)^{th}$ row; and, wherein each of the vias of the ball grid arrangement are spaced apart between every pair of adjacent thermal balls on the bottom surface of the associated substrate.

12. A ball grid arrangement according to claim 11 wherein:
wherein the plurality of thermal balls are selectively disposed in the n×m array solely within the $2^{nd}$ to $(n-1)^{th}$ rows and solely within the $2^{nd}$ to $(m-1)^{th}$ columns.

13. A ball grid arrangement according to claim 12 wherein:
the plurality of thermal balls selectively disposed in the n×m array solely within the $2^{nd}$ to $(n-1)^{th}$ rows and solely within the $2^{nd}$ to $(m-1)^{th}$ columns fill the $2^{nd}$ to $(n-1)^{th}$ rows and the $2^{nd}$ to $(m-1)^{th}$ columns.

14. A ball grid arrangement according to claim 11 wherein:
wherein the plurality of thermal balls are selectively disposed in the n×n array at corners defined by the $2^{nd}$ and $(n-1)^{th}$ rows and the $2^{nd}$ and $(m-1)^{th}$ columns.

* * * * *